(12) United States Patent
Jung et al.

(10) Patent No.: US 8,638,383 B2
(45) Date of Patent: Jan. 28, 2014

(54) CORRELATED DOUBLE SAMPLING CIRCUIT AND IMAGE SENSOR INCLUDING THE SAME

(75) Inventors: Wun-Ki Jung, Suwon-si (KR); Seog Heon Ham, Suwon-si (KR); Dong Hun Lee, Yongin-si (KR); Kwi Sung Yoo, Seoul (KR); Min Ho Kwon, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 386 days.

(21) Appl. No.: 13/171,958

(22) Filed: Jun. 29, 2011

(65) Prior Publication Data

US 2012/0002093 A1 Jan. 5, 2012

(30) Foreign Application Priority Data

Jul. 2, 2010 (KR) .................... 10-2010-0064090

(51) Int. Cl.
*H04N 3/14* (2006.01)
*H04N 5/335* (2011.01)
(52) U.S. Cl.
USPC .................. 348/302; 348/241; 341/157
(58) Field of Classification Search
None
See application file for complete search history.

(56) References Cited

U.S. PATENT DOCUMENTS

| | | | |
|---|---|---|---|
| 6,665,013 B1 * | 12/2003 | Fossum et al. | 348/308 |
| 6,992,606 B2 | 1/2006 | Zogakis et al. | |
| 2004/0080629 A1 * | 4/2004 | Sato et al. | 348/222.1 |
| 2004/0100461 A1 * | 5/2004 | Fortier | 345/204 |
| 2006/0176198 A1 * | 8/2006 | Doty | 341/143 |
| 2006/0232676 A1 * | 10/2006 | Boemler | 348/172 |
| 2008/0111059 A1 * | 5/2008 | Lee et al. | 250/214 DC |
| 2008/0169952 A1 * | 7/2008 | Boemler | 341/143 |
| 2009/0261998 A1 * | 10/2009 | Chae et al. | 341/118 |
| 2009/0289823 A1 * | 11/2009 | Chae et al. | 341/143 |
| 2009/0295956 A1 * | 12/2009 | Chae et al. | 348/294 |

FOREIGN PATENT DOCUMENTS

| | | |
|---|---|---|
| JP | 11-145838 | 5/1999 |
| JP | 2004-015208 | 1/2004 |
| KR | 1020010023942 | 3/2001 |

* cited by examiner

*Primary Examiner* — Nelson D. Hernández Hernández
*Assistant Examiner* — Dennis Hogue
(74) *Attorney, Agent, or Firm* — F. Chau & Associates, LLC

(57) ABSTRACT

A correlated double sampling circuit includes a delta-sigma modulator, a selection circuit, and an accumulation circuit. The delta-sigma modulator is configured to receive an input signal, delta-sigma modulate the input signal, and output a modulation signal. The selection circuit is configured to invert the modulation signal and selectively output one of the modulation signal and an inverted modulation signal in response to a selection signal corresponding to an operation phase. The accumulation circuit is configured to generate a first accumulation result by performing an accumulation process on one of the modulation signal and the inverted modulation signal in a first operation phase, and generate a second accumulation result by performing the accumulation process on the first accumulation result and the other one of the modulation signal and the inverted modulation signal in a second operation phase.

20 Claims, 8 Drawing Sheets

CORRELATED DOUBLE SAMPLING CIRCUIT AND IMAGE SENSOR INCLUDING THE SAME

CROSS-REFERENCE TO RELATED APPLICATIONS

This application claims priority under 35 U.S.C. §119 to Korean Patent Application No. 10-2010-0064090, filed on Jul. 2, 2010, the disclosure of which is incorporated by reference herein in its entirety.

BACKGROUND

The present inventive concept relates to correlated double sampling (CDS), and more particularly, to a CDS circuit for performing CDS without utilizing a subtractor or an accumulator which performs a subtraction operation, and an image sensor including the same.

CDS is a technique of sampling or reading a signal value with respect to a reference value. CDS may be performed to remove an offset from a signal to attain a pure signal. CDS is widely used in image sensors.

An offset between pixels or channels in image sensors may cause fixed pattern noise to occur in images. CDS may be used to correct this phenomenon. For example, an offset and fixed pattern noise may occur between columns in complementary metal-oxide semiconductor (CMOS) image sensors, which include an analog-to-digital converter (ADC) for each column. CDS may be used to remove the offset and to reduce the fixed pattern noise between the columns.

When CDS is implemented digitally, a subtraction operation is performed to generate a difference between the result of analog-to-digital conversion on a reference value, and the result of analog-to-digital conversion on a signal value. A separate subtractor or an accumulator which performs subtraction may be used to perform this subtraction operation.

When a separate subtractor is used to perform the subtraction operation, the CDS operation includes overhead corresponding to the subtractor and memory. When the accumulator is used to perform the subtraction operation, a circuit configured to perform the subtraction operation is included in the accumulator. When a separate subtractor is provided for each column, or when a subtraction circuit is additionally provided in an accumulator, overhead in image sensors is increased.

SUMMARY

Exemplary embodiments of the present inventive concept provide a correlated double sampling (CDS) circuit for performing CDS without using a separate subtractor or an accumulator configured to perform a subtraction function, and an image sensor including the same.

According to an exemplary embodiment of the present inventive concept, a CDS circuit includes a delta-sigma modulator, a selection circuit, and an accumulation circuit. The delta-sigma modulator is configured to receive an input signal, delta-sigma modulate the input signal, and output a modulation signal. The selection circuit is configured to invert the modulation signal, and selectively output one of the modulation signal and an inverted modulation signal in response to a selection signal corresponding to an operation phase. The accumulation circuit is configured to generate a first accumulation result by performing an accumulation process on one of the modulation signal and the inverted modulation signal in a first operation phase, and generate a second accumulation result by performing the accumulation process on the first accumulation result and the other one of the modulation signal and the inverted modulation signal in a second operation phase.

The selection circuit may include an inverter configured to receive the modulation signal and generate the inverted modulation signal, and a selector configured to selectively output one of the modulation signal and the inverted modulation signal in response to the selection signal.

The accumulation circuit may include first through N-th accumulators connected in series. N is a natural number greater than or equal to 2. The first accumulator is configured to accumulate an output signal of the selection circuit. The second through N-th accumulators are configured to accumulate an output signal of a previous accumulator. The accumulation circuit may be reset before performing the accumulation process in the first operation phase.

An initial value of the accumulation circuit may be set to one of a positive maximum accumulated value of the accumulation circuit, a negative maximum value of the accumulation circuit, a value of 0, or an offset value based on the signal accumulated in the first operation phase.

The CDS circuit may further include an operation circuit configured to add or subtract a maximum accumulated value of the accumulation circuit to or from an accumulation result output by the accumulation circuit, based on the signal accumulated in the first operation phase.

According to an exemplary embodiment of the present inventive concept, a CDS circuit includes a delta-sigma modulator, a selector, and an accumulation circuit. The delta-sigma modulator is configured to receive an input signal, delta-sigma modulate the input signal, invert a modulation signal, and output the modulation signal and an inverted modulation signal. The selector is configured to selectively output one of the modulation signal and an inverted modulation signal in response to a selection signal corresponding to an operation phase. The accumulation circuit is configured to generate a first accumulation result by performing an accumulation process on one of the modulation signal and the inverted modulation signal in a first operation phase, and generate a second accumulation result by performing the accumulation process on the first accumulation result and the other one of the modulation signal and the inverted modulation signal in a second operation phase.

The accumulation circuit may include first through N-th accumulators connected in series. N is a natural number greater than or equal to 2. The first accumulator is configured to accumulate one of the modulation signal and the inverted modulation signal. The second through N-th accumulators are configured to accumulate an output signal of a previous accumulator. The first accumulator may be reset before performing the accumulation process in the first operation phase.

An initial value of the accumulation circuit may be set to one of a positive maximum accumulated value of the accumulation circuit, a negative maximum value of the accumulation circuit, a value of 0, or an offset value based on the signal accumulated in the first operation phase.

The CDS circuit may further include an operation circuit configured to add or subtract a maximum accumulated value of the accumulation circuit to or from an accumulation result output by the accumulation circuit, based on the signal accumulated in the first operation phase.

According to an exemplary embodiment of the present inventive concept, an image sensor includes a pixel array comprising a plurality of pixels, and a CDS circuit. The CDS circuit includes a delta-sigma modulator, a selection circuit, and an accumulation circuit. The delta-sigma modulator is configured to receive an input signal, delta-sigma modulate the input signal, and output a modulation signal. The input signal includes pixel data corresponding to one of the plurality of pixels. The selection circuit is configured to invert the modulation signal, and selectively output one of the modulation signal and an inverted modulation signal in response to a selection signal corresponding to an operation phase. The accumulation circuit is configured to generate a first accumulation result by performing an accumulation process on one of the modulation signal and the inverted modulation signal in a first operation phase, and generate a second accumulation result by performing the accumulation process on the first accumulation result and the other one of the modulation signal and the inverted modulation signal in a second operation phase.

According to an exemplary embodiment of the present inventive concept, an image sensor includes a pixel array including a plurality of pixels, and a CDS circuit. The CDS circuit includes a delta-sigma modulator, a selector, and an accumulation circuit. The delta-sigma modulator is configured to receive an input signal, delta-sigma modulate the input signal, invert a modulation signal, and output the modulation signal and the inverted modulation signal. The input signal includes pixel data corresponding to one of the plurality of pixels. The selector is configured to selectively output one of the modulation signal and the inverted modulation signal in response to a selection signal corresponding to an operation phase. The accumulation circuit is configured to generate a first accumulation result by performing an accumulation process on one of the modulation signal and the inverted modulation signal in a first operation phase, and generate a second accumulation result by performing the accumulation process on the first accumulation result and the other one of the modulation signal and the inverted modulation signal in a second operation phase.

According to an exemplary embodiment of the present inventive concept, a CDS circuit includes a delta-sigma modulator, a selection circuit, and an accumulation circuit. The delta-sigma modulator is configured to receive an input signal, delta-sigma modulate the input signal, and output a modulation signal. The selection circuit is configured to invert the modulation signal, output an inverted modulation signal while in a reference phase, and output the modulation signal while in a signal phase. The accumulation circuit is configured to generate a first accumulation result by performing an accumulation process on the inverted modulation signal while in the reference phase, and generate a second accumulation result by performing the accumulation process on the modulation signal and the first accumulation result while in the signal phase. The input signal is equal to a sum of a reference signal and an offset component in the reference phase, and the input signal is equal to a sum of the reference signal, the offset component, and a signal component in the signal phase.

The reference signal may be equal to one of the modulation signal and the inverted modulation signal in the reference phase, and a sum of the reference signal and the signal component may be equal to the other one of the modulation signal and the inverted modulation signal in the signal phase.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION

Exemplary embodiments of the present inventive concept will be described more fully hereinafter with reference to the accompanying drawings. Like numbers may refer to like elements throughout the accompanying drawings.

It will be understood that when an element is referred to as being "connected" or "coupled" to another element, it can be directly connected or coupled to the other element or intervening elements may be present.

Figure 1:
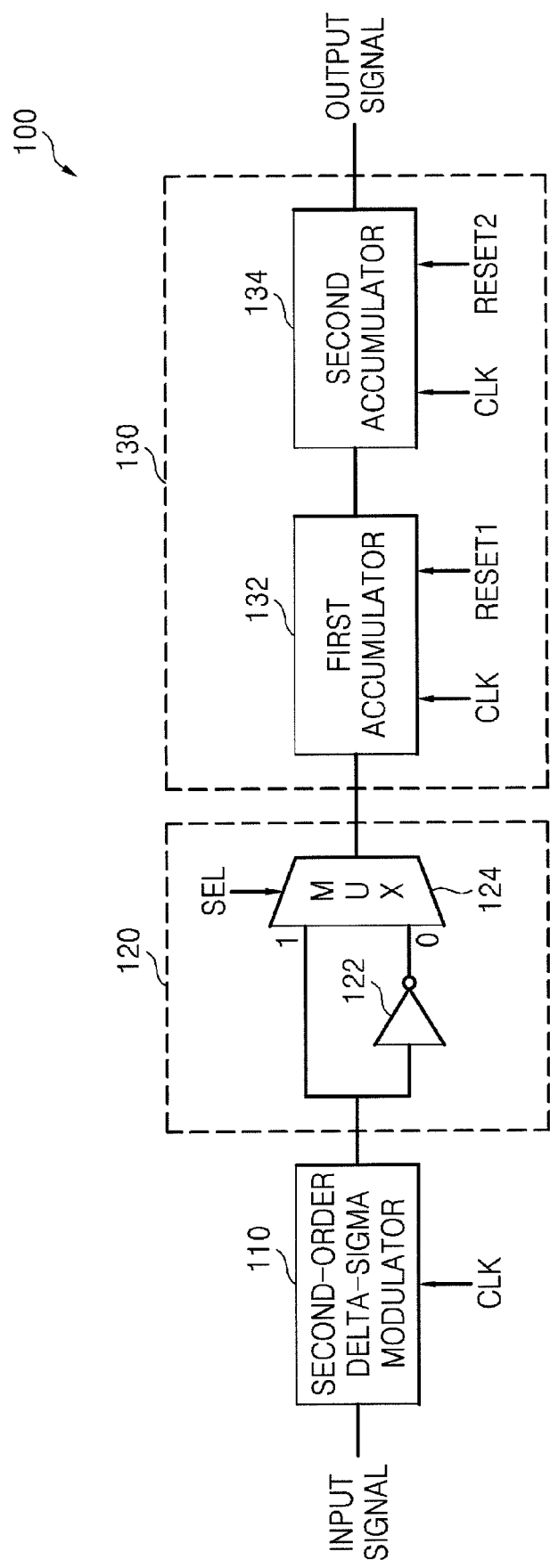
FIG. 1 is a block diagram of a correlated double sampling (CDS) circuit according to an exemplary embodiment of the present inventive concept.

FIG. 1 is a block diagram of a correlated double sampling (CDS) circuit 100 according to an exemplary embodiment of the present inventive concept. The CDS circuit 100 is capable of performing CDS without utilizing a separate circuit configured to perform a subtraction operation, and without an accumulator performing a subtraction operation. Referring to FIG. 1, the CDS circuit 100 includes a delta-sigma modulator 110, a selection circuit 120, and an accumulation circuit 130.

The delta-sigma modulator 110 receives an input signal and delta-sigma modulates the input signal into a digital signal in response to a clock signal CLK. The resulting modulation signal is then output. The delta-sigma modulator 110 illustrated in FIG. 1 is a second-order delta-sigma modulator, however, the present inventive concept is not limited thereto. The input signal input to the delta-sigma modulator 110 may be an analog signal or a sampled direct current (DC) signal, however, the input signal is not limited thereto. For example, the input signal may be DC pixel data output from a pixel of an image sensor.

The selection circuit 120 outputs a modulation result (e.g., a modulation signal based on the input signal or an inverted signal based on the modulation signal) in response to a selection signal SEL according to an operation phase of the CDS circuit 100. The selection circuit 120 may include an inverter 122 and a selector 124, as illustrated in FIG. 1. The selector 124 may be, for example, a multiplexer. The operation phase of the CDS circuit 100 may be a reference phase for sampling a reference signal and an offset component, or a signal phase for sampling the reference signal, the offset component, and a signal component.

The inverter 122 receives the modulation signal output from the delta-sigma modulator 110 and inverts the modulation signal to generate an inverted modulation signal (e.g., an inverted modulation result of the input signal). The selector 124 selectively outputs the modulation signal or the inverted modulation signal in response to the selection signal SEL.

The selector 124 may select and output the inverted modulation signal when the operation phase of the CDS circuit 100 is the reference phase, and may select and output the modulation signal when the operation phase of the CDS circuit 100 is the signal phase, or vice versa.

The accumulation circuit 130 performs an accumulation process on one of the two signals. For example, in response to the clock signal CLK, one of the modulation signal and the inverted modulation signal is accumulated in a first operation phase, and the other one of the modulation signal and the inverted modulation signal is accumulated with the accumulation result obtained from the first operation phase in a second operation phase. For example, the accumulation circuit 130 may accumulate the inverted modulation signal while the CDS circuit 100 is in the reference phase, and may accumulate the modulation signal with the accumulation result obtained from the reference phase while the CDS circuit 100 is in the signal phase. Conversely, the modulation signal may be accumulated in the reference phase and the inverted modulation signal may be accumulated in the signal phase.

The accumulation circuit 130 may include first through N-th accumulators connected in series, where N is a natural number greater than or equal to 2. The accumulation circuit 130 may be a second-order accumulation circuit corresponding to the second-order delta-sigma modulator 110 in the CDS circuit 100 illustrated in FIG. 1. However, the present inventive concept is not limited thereto.

According to an exemplary embodiment, when the delta-sigma modulator 110 is a first-order modulator, the accumulation circuit 130 may be a first-order accumulation circuit. The basic structure of the first-order accumulation circuit may be a counter. According to an exemplary embodiment, when the delta-sigma modulator 110 is a second-order or higher-order modulator, the accumulation circuit 130 may be a second-order or a higher-order accumulation circuit. The basic structure of the second-order or higher-order accumulation circuit may be an integrator including at least two accumulators.

In the second-order or higher-order accumulation circuit, a first accumulator 132 accumulates an output signal of the selection circuit 120, and a second accumulator 134 accumulates an output signal of the first accumulator 132. Thus, the second through N-th accumulators accumulate an output signal of a previous accumulator.

According to an exemplary embodiment, the accumulation circuit 130 may be reset before performing accumulation in the first operation phase. For example, the first accumulator 132 is reset before performing the accumulation process in the first operation phase. Since the input signal is subject to CDS based on a predetermined number of clock cycles in the CDS circuit 100, once accumulation of the input signal corresponding to the predetermined number of clock cycles is completed, the accumulation circuit 130 is initialized to perform accumulation of the input signal corresponding to the subsequent predetermined number of clock cycles.

In order to eliminate a circuit used for performing a subtraction operation on the accumulation results obtained in the reference phase and the signal phase, the CDS circuit 100 performs the accumulation process on the modulation signal and the inverted modulation signal, respectively. As a result, the accumulation result obtained by the CDS circuit 100 includes an additional accumulation result. The additional accumulation result may be a positive or negative maximum accumulated value. The maximum accumulated value is determined based on the predetermined number of clock cycles of the input signal. For example, when the input signal is input using 10 clock cycles and a first-order accumulation circuit, the maximum accumulated value is 10. When the input signal is input using 10 clock cycles and a second-order accumulation circuit, the maximum accumulated value is +55. This additional accumulation result should be eliminated. To eliminate the additional accumulation result, an initial value of the accumulation circuit 130 may be set, or the output of the accumulation circuit 130 may be connected to an additional operation circuit (not shown) configured to eliminate the additional accumulation result (e.g., the maximum accumulated value).

According to an exemplary embodiment, when the initial value of the accumulation circuit 130 is set to eliminate the additional accumulation result, the initial value may be set to, for example, the positive or negative maximum accumulated value that the accumulation circuit 130 may have, a value of 0, or a predetermined offset value based on the signal that is accumulated in the first operation phase (e.g., the modulation signal or the inverted modulation signal). For example, when the inverted signal is accumulated in the first operation phase (e.g., the reference phase), the modulation signal is accumulated in the second operation phase (e.g., the signal phase), and the input signal is received using 10 clock cycles, the positive maximum accumulated value (e.g., +55) of the accumulation circuit 130 is additionally accumulated. To eliminate this additional accumulation result, the initial value of the accumulation circuit 130 is set to −55. Conversely, when the modulation signal is accumulated in the first operation phase (e.g., the reference phase), the negative maximum accumulated value (e.g., −55) of the accumulation circuit 130 is additionally accumulated. Accordingly, the initial value of the accumulation circuit 130 is set to +55.

Rather than setting an initial value of the accumulation circuit 130, an additional operation circuit (not shown) may be connected to the output of the accumulation circuit 130 to eliminate the additional accumulation result. As described above, when the inverted modulation signal is accumulated in the first operation phase (e.g., the reference phase), the additional accumulation result is +55. Accordingly, when the inverted modulation signal is accumulated in the first operation phase, the operation circuit is a subtraction circuit configured to eliminate the value of +55. Conversely, when the modulation signal is accumulated in the first operation phase (e.g., the reference phase), the additional accumulation result is −55. Accordingly, when the modulation signal is accumulated in the first operation phase, the operation circuit is an addition circuit configured to eliminate the value of −55. The overhead induced by using an additional operation circuit to perform an addition or subtraction operation after the accumulation process is likely less than the overhead induced by using a subtractor during CDS.

As will be appreciated by those having ordinary skill in the art, the initial value of the accumulation circuit 130 is not limited to the positive or negative maximum accumulated value, or a value of 0. Rather, the initial value of the accumulation circuit 130 may be set to any predetermined value. For example, an offset may be taken into consideration when setting the initial value of the accumulation circuit 130.

Figure 2:
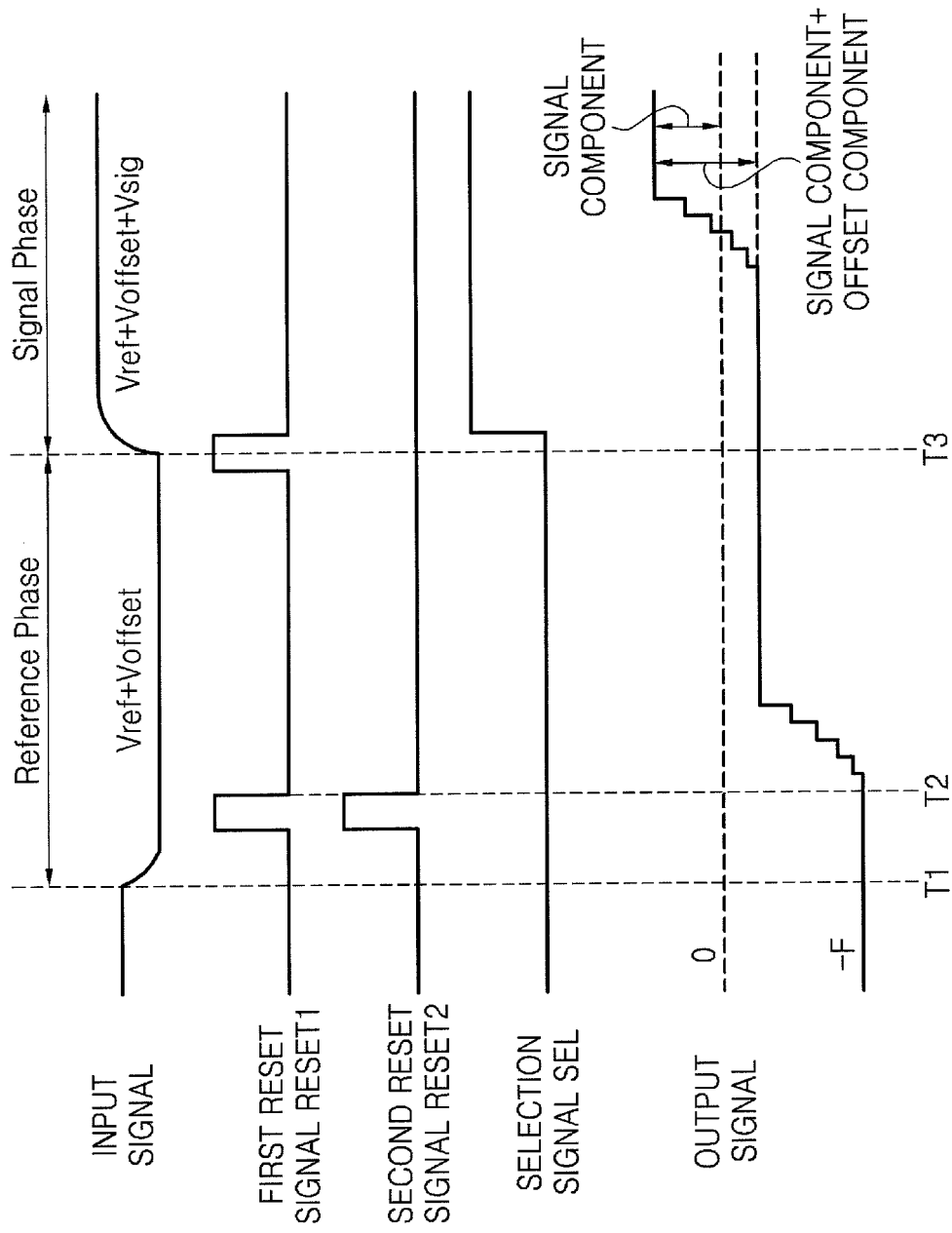
FIG. 2 is a diagram illustrating the operation of the CDS circuit shown in FIG. 1.

FIG. 2 is a diagram illustrating the operation of the CDS circuit 100 shown in FIG. 1. The operation of the CDS circuit 100 is described below with reference to FIGS. 1 and 2.

The input signal is the sum of a reference signal Vref and an offset component Voffset in the reference phase of the CDS circuit 100, and the sum of the reference signal Vref, the offset component Voffset, and a signal component Vsig in the signal phase of the CDS circuit 100. According to an exemplary embodiment of the present inventive concept, the reference signal Vref may be equal to one of the modulation signal and the inverted modulation signal in the reference phase, and the sum of the reference signal Vref and the signal component Vsig may be equal to the other one of the two signals in the signal phase. For example, when the reference signal Vref is equal to the modulation signal in the reference phase, the sum of the reference signal Vref and the signal component Vsig is equal to the inverted modulation signal in the signal phase. When the reference signal Vref is equal to the inverted modulation signal in the reference phase, the sum of the reference signal Vref and the signal component Vsig is equal to the modulation signal in the signal phase.

When the CDS circuit 100 starts operation at time T1, the accumulation circuit 130 is reset in response to a first reset signal RESET1 and a second reset signal RESET2 while in the reference phase. For example, the first accumulator 132 may be reset in response to the first reset signal RESET1, and the second accumulator 134 may be reset in response to the second reset signal RESET2. The selection circuit 120 outputs the inverted modulation signal in response to the selection signal SEL. At this time, the initial value of the accumulation circuit 130 is set to a negative value −F. The negative value −F is the maximum accumulated value that the second-order accumulation circuit 130 can have with respect to the input signal. After the first accumulator 132 is reset, the accumulation circuit 130 performs the accumulation process on the inverted modulation signal starting at a time T2.

After the accumulation process has completed in the reference phase, the operation phase of the CDS circuit 100 is changed to the signal phase at a time T3. The selection circuit 120 outputs the modulation signal in response to the selection signal SEL. The accumulation circuit 130 accumulates the modulation signal with the accumulation result obtained in the reference phase.

Referring to FIG. 2, once the accumulation process in the signal phase has completed, an output signal of the CDS circuit 100 includes only the signal component Vsig, since the offset component Voffset has been removed. Thus, the CDS circuit 100 performs CDS without a separate circuit configured to perform a subtraction operation.

Figure 3:
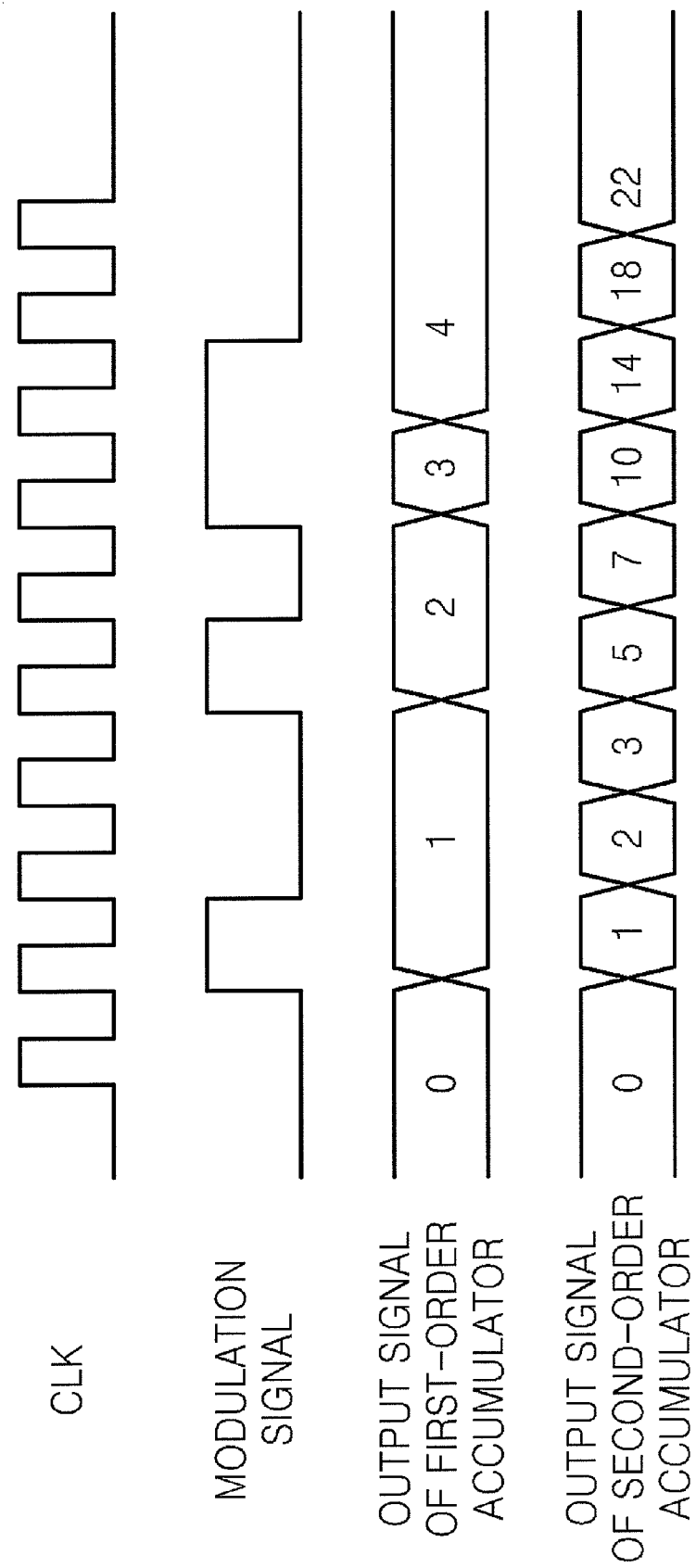
FIG. 3 is a diagram illustrating output signals of the CDS circuit shown in FIG. 1 with respect to a modulation signal.

FIG. 3 shows output signals of the CDS circuit 100 illustrated in FIG. 1 with respect to the modulation signal. Referring to FIG. 3, the modulation signal based on the input signal corresponding to 10 clock cycles is in a high state for 4 clock cycles. Accordingly, the accumulation result of a first-order accumulator is 4 and the accumulation result of a second-order accumulator, which accumulates the accumulation result of the first-order accumulator, is 22. If the modulation signal based on the input signal is in the high state for all 10 clock cycles, the accumulation result of the first-order accumulator is 10 (e.g., the maximum accumulated value of the first-order accumulator), and the accumulation result of the second-order accumulator is 55 (e.g., the maximum accumulated value of the second-order accumulator).

Figure 4:
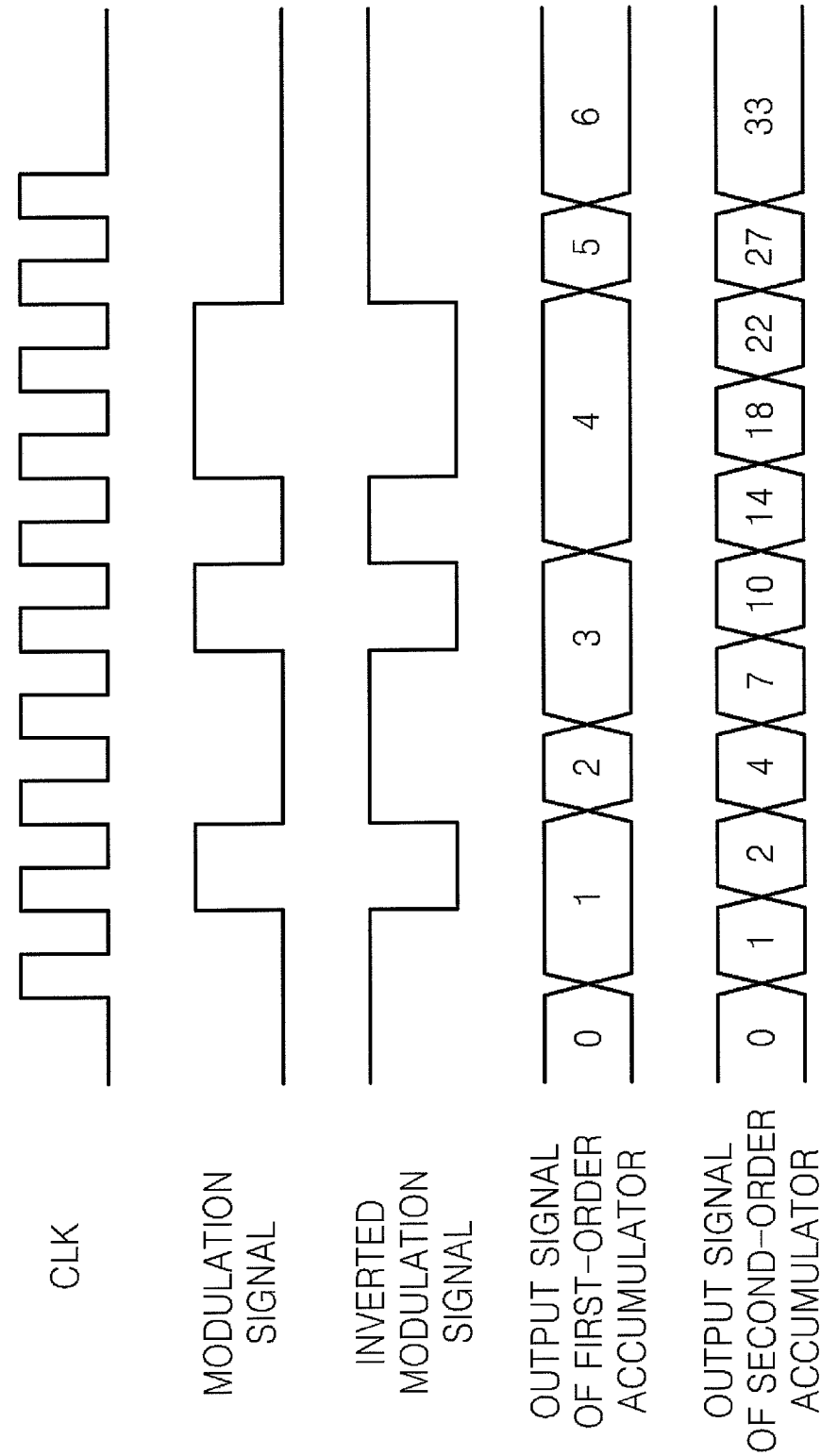
FIG. 4 is a diagram illustrating output signals of the CDS circuit shown in FIG. 1 with respect to a modulation signal and an inverted modulation signal.

FIG. 4 shows output signals of the CDS circuit 100 illustrated in FIG. 1 with respect to the modulation signal and the inverted modulation signal. Referring to FIGS. 3 and 4, the outputs of the first-order and the second-order accumulators referred to in FIG. 4 are the results of respectively subtracting the final outputs of the first-order and the second-order accumulators referred to in FIG. 3 from the maximum accumulated values that the first-order and the second-order accumulators can respectively have with respect to 10 clock cycles. Equation (1) can be drawn from the accumulation results illustrated in FIGS. 3 and 4:

$$F = X + X', \qquad (1)$$

where F is the maximum accumulated value that an accumulator can have, X is the accumulation result corresponding to the modulation signal, and X' is the inverted modulation signal.

Digital CDS includes obtaining a difference between the results of two analog-to-digital conversion processes. For example, when an accumulation result obtained in the reference phase is represented by "A," and an accumulation result obtained in the signal phase is represented by "B," the desired value is (B−A). According to exemplary embodiments of the present inventive concept, when accumulation in the reference phase is based on the inverted modulation signal, and the accumulation in the signal phase is based on the modulation signal, Equation (2) can be drawn:

$$A' + B = (F - A) + B = F + (B - A), \qquad (2)$$

where A' is the accumulation result of the inverted modulation signal.

When the maximum accumulated value F that an accumulator can have is removed from Equation (1), the desired value (B−A) can be obtained. To remove the maximum accumulated value F, the initial value of the accumulation circuit 130 may be set, or a separate operation circuit may be used, as described above.

According to exemplary embodiments, the CDS circuit 100 can perform CDS without utilizing a subtractor, a memory for subtraction, or a subtraction circuit disposed in an accumulator, by using the modulation signal and the inverted modulation signal as described above.

Figure 5:
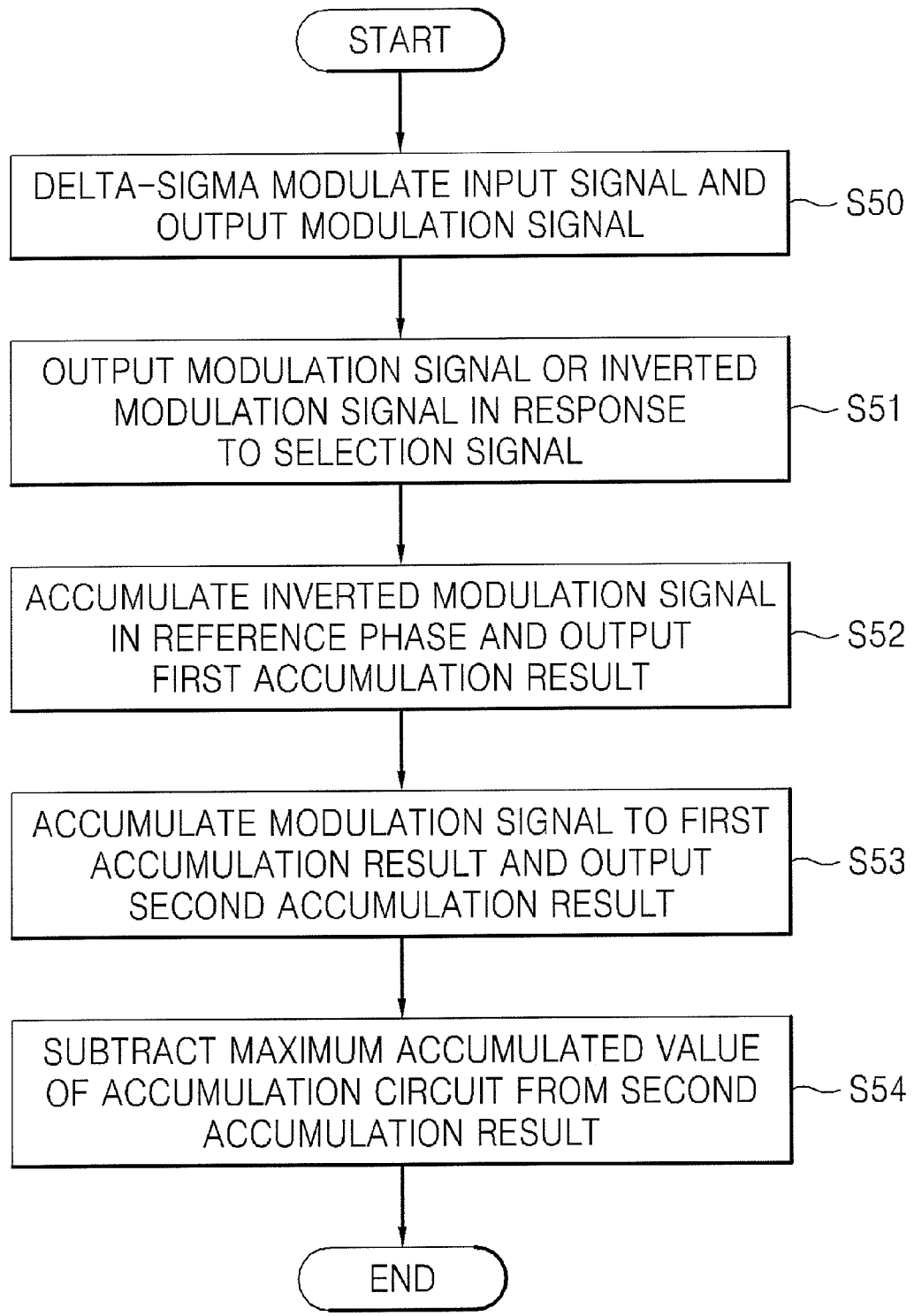
FIG. 5 is a flowchart of a CDS method according to an exemplary embodiment of the present inventive concept.

FIG. 5 is a flowchart of a CDS method according to an exemplary embodiment of the present inventive concept. The CDS method is described with reference to FIGS. 1 and 5 below.

The delta-sigma modulator 110 receives an input signal, delta-sigma modulates the input signal, and outputs a modulation signal in operation S50. The selection circuit 120 outputs the modulation signal, or inverts the modulation signal and outputs the inverted modulation signal, in response to the selection signal SEL in operation S51.

The accumulation circuit 130 accumulates the inverted modulation signal in a reference phase and outputs a first accumulation result in operation S52, and accumulates the modulation signal with the first accumulation result in a signal phase and outputs a second accumulation result in operation S53. As described above, since the second accumulation result includes the maximum accumulated value that the accumulation circuit 130 can have, the maximum accumulated value is removed in operation S54.

As will be understood by those of ordinary skill in the art, the present inventive concept may be embodied as hardware, software or a combination thereof. The present inventive concept may also be embodied as computer-readable code stored on a computer-readable medium. The computer-readable medium may be any data storage device that can store data as a program which can be read by a computer system. For example, the computer-readable medium may include, but is not limited to, read-only memory (ROM), random-access memory (RAM), CD-ROMs, magnetic tapes, floppy disks, and/or optical data storage devices. The computer-readable medium may be distributed to computer systems connected to a network. Functional programs, codes, and code segments may be used to carry out the present inventive concept.

Figure 6:
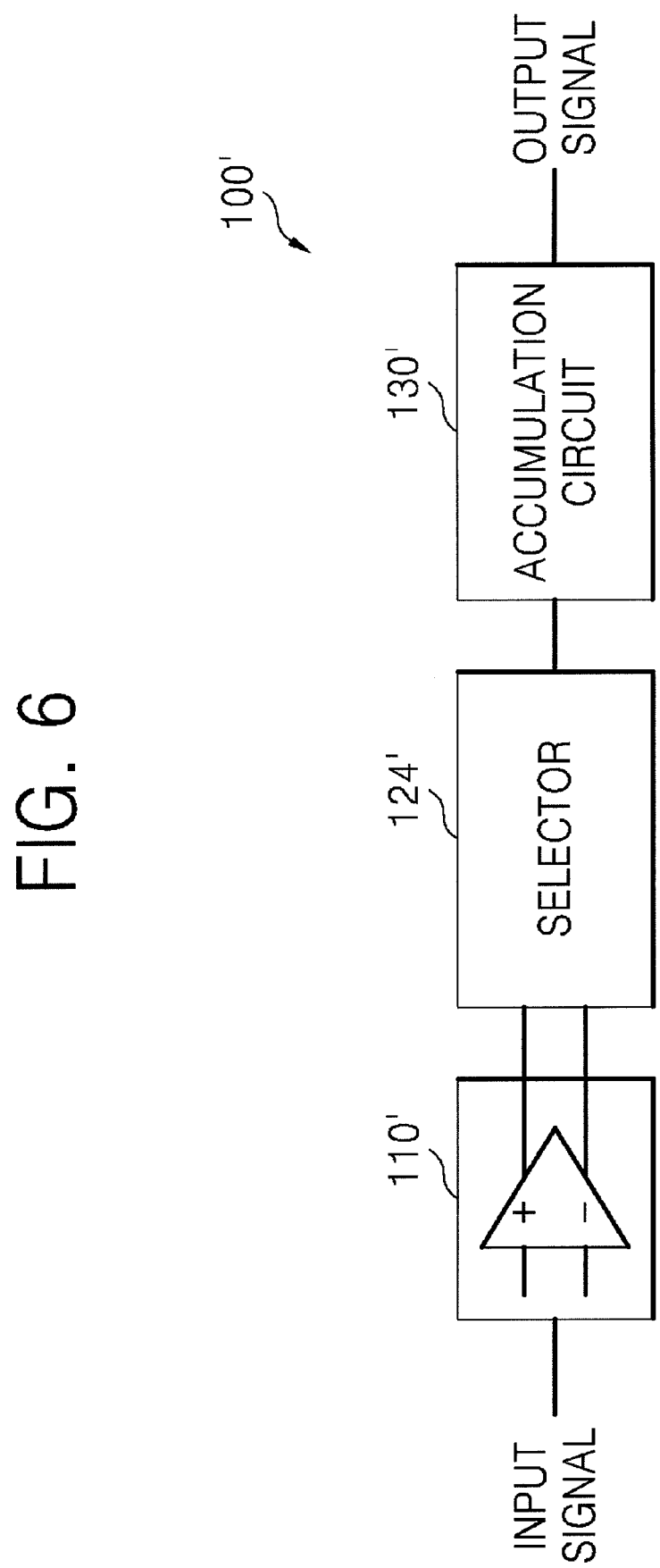
FIG. 6 is a block diagram of a CDS circuit according to an exemplary embodiment of the present inventive concept.

FIG. 6 is a block diagram of a CDS circuit 100' according to an exemplary embodiment of the present inventive concept. A delta-sigma modulator 110' included in the CDS circuit 100' simultaneously generates differential signals (e.g., a modulation signal based on an input signal and an inverted modulation signal based on the input signal). Accordingly, the CDS circuit 100' includes a selector 124' and does not include an inverter configured to invert the modulation signal. The selector 124' may be, for example, a multiplexer, and is configured to selectively output the modulation signal or the inverted modulation signal in response to a selection signal according to an operation phase of the CDS circuit 100'. According to the exemplary embodiment shown in FIG. 6, the selector 124' may be disposed within the delta-sigma modulator 110'. For example, unlike the delta-sigma modulator 110 illustrated in FIG. 1, which outputs only the modulation signal, the delta-sigma modulator 110' illustrated in FIG. 6 outputs both the modulation signal and the inverted modulation signal. An accumulation circuit 130' included in the CDS circuit 100' illustrated in FIG. 6 performs accumulation on either of the differential signals output by the delta-sigma modulator 110' according to the operation phase of the CDS circuit 100'.

As will be appreciated by one having ordinary skill in the art, all or part of each element of the CDS circuits 100 and 100' may be implemented in software, hardware, or any combination thereof.

Figure 7:
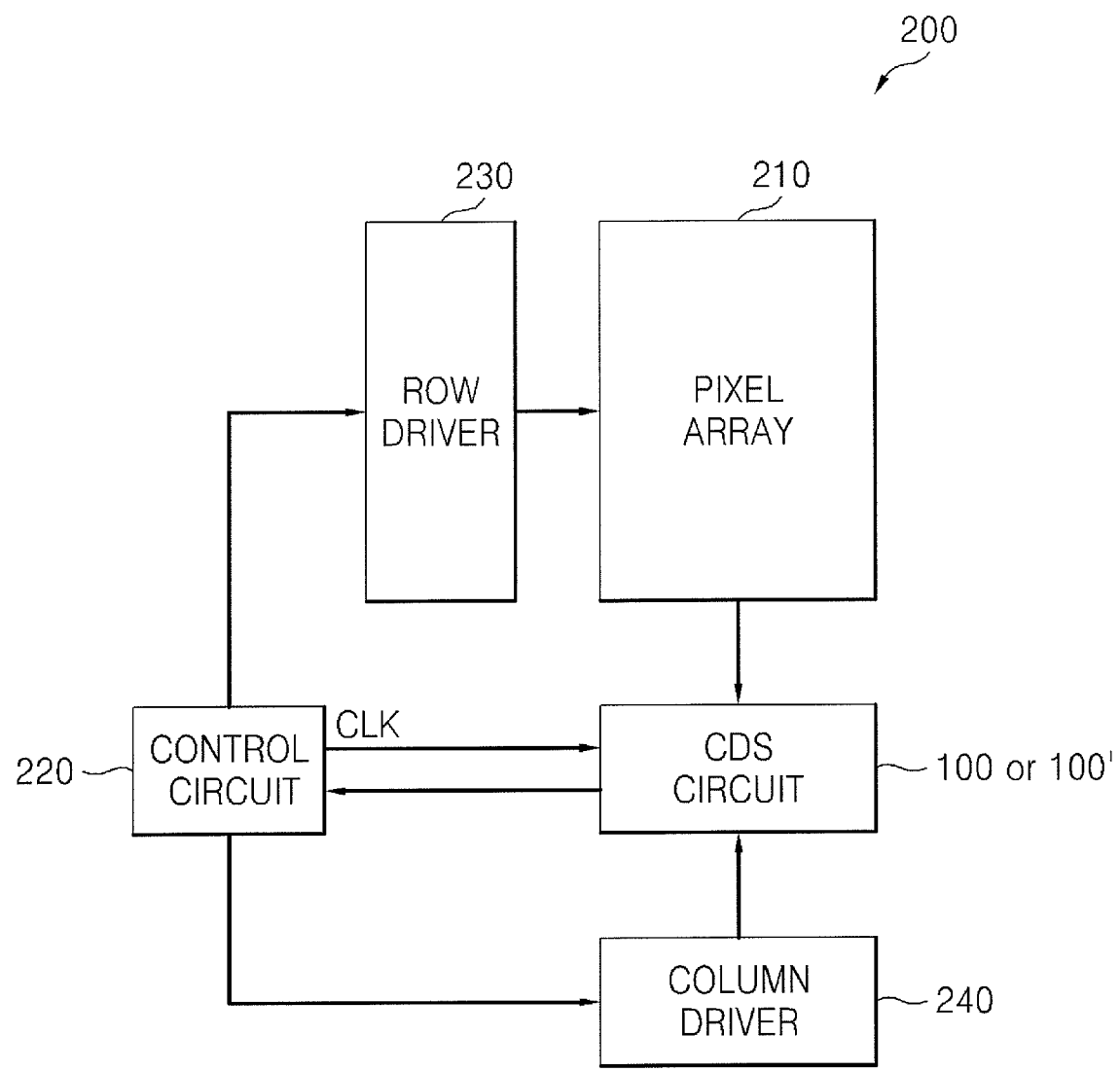
FIG. 7 is a block diagram of an image sensor according to an exemplary embodiment of the present inventive concept.

FIG. 7 is a block diagram of an image sensor 200 according to an exemplary embodiment of the present inventive concept. Referring to the exemplary embodiment shown in FIG. 7, the image sensor 200 includes the CDS circuit 100 or 100', a pixel array 210, a control circuit 220, a row driver 230, and a column driver 240.

The pixel array 210 includes a plurality of pixels (not shown) in a matrix form. Each of the pixels represent data corresponding to an image received from an external source. The control circuit 220 generates a clock signal CLK and a plurality of control signals. The clock signal CLK is input to the CDS circuit 100 or 100' and the control signals are input to the row driver 230 and the column driver 240.

The row driver 230 selects a certain row in the pixel array 210 based on one of the control signals. The column driver 240 selects a digital signal of a certain column from among a plurality of digital signals based on one of the control signals.

The CDS circuit 100 or 100' receives pixel data output from a selected pixel among the plurality of pixels as an input signal, and converts the input signal into a digital signal. Since the image sensor 200 includes the CDS circuit 100 or 100', the image sensor 200 can perform CDS on the pixel data in the manner described above with reference to FIGS. 1 to 6.

According to exemplary embodiments, all or part of each element of the CDS circuits 100 and 100' and the image sensor 200, and any combination thereof, may be installed using a variety of packages. The various packages may include, for example, Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi-Chip Package (MCP), Wafer-level Fabricated Package (WFP), and Wafer-Level Processed Stack Package (WSP), however, the various packages are not limited thereto.

Figure 8:
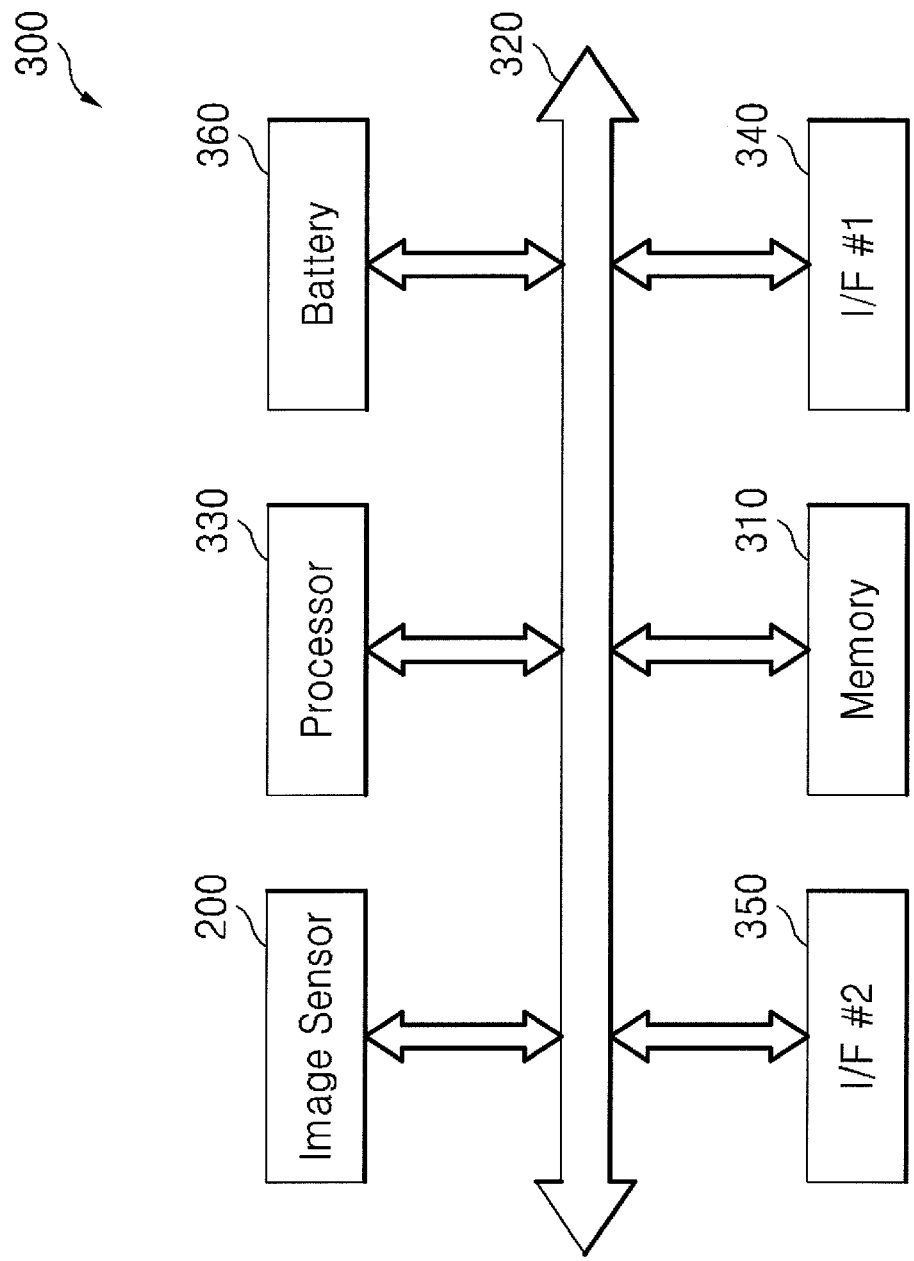
FIG. 8 is a block diagram of an electronic system according to an exemplary embodiment of the present inventive concept.

FIG. 8 is a block diagram of an electronic system 300 according to an exemplary embodiment of the present inventive concept. Referring to FIG. 8, the electronic system 300 may include the image sensor 200, a memory device 310, and a processor 330, which are connected to a system bus 320. The image sensor 200 performs CDS on pixel data in the manner described above with reference to FIG. 7.

The electronic system 300 may be, for example, a digital camera, a cellular telephone equipped with a digital camera, or a satellite system equipped with a camera, however the present inventive concept is not limited thereto.

The processor 330 may generate a plurality of control signals for controlling the operations of the image sensor 200 and the memory device 310. The image sensor 200 may generate an image of an object and the memory device 310 may store the image.

When the electronic system 300 is implemented as a portable device, it may also include a battery 360 to supply power to the electronic system 300. The electronic system 300 may also include interface devices such as, for example, input/output devices 340 and 350, allowing data to be received from and transmitted to an external data processing device (not shown).

As described above, a CDS circuit and an image sensor including the same according to exemplary embodiments of the present inventive concept do not include a separate subtractor or an accumulator including a subtractor circuit for performing subtraction during CDS. As a result, the design of the CDS circuit may be simplified, and the size of the CDS circuit may be reduced.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A correlated double sampling circuit, comprising:
   a delta-sigma modulator configured to receive an input signal, delta-sigma modulate the input signal, and output a modulation signal;
   a selection circuit configured to invert the modulation signal, and selectively output one of the modulation signal and an inverted modulation signal in response to a selection signal corresponding to an operation phase; and
   an accumulation circuit configured to generate a first accumulation result by performing an accumulation process on one of the modulation signal and the inverted modulation signal in a first operation phase, and generate a second accumulation result by performing the accumulation process on the first accumulation result and the other one of the modulation signal and the inverted modulation signal in a second operation phase.

2. The correlated double sampling circuit of claim 1, wherein the selection circuit comprises:
   an inverter configured to receive the modulation signal and generate the inverted modulation signal; and
   a selector configured to selectively output one of the modulation signal and the inverted modulation signal in response to the selection signal.

3. The correlated double sampling circuit of claim 1, wherein the accumulation circuit comprises:
   first through N-th accumulators connected in series, wherein
   N is a natural number greater than or equal to 2,
   the first accumulator is configured to accumulate an output signal of the selection circuit, and
   the second through N-th accumulators are configured to accumulate an output signal of a previous accumulator.

4. The correlated double sampling circuit of claim 1, wherein the accumulation circuit is reset before performing the accumulation process in the first operation phase.

5. The correlated double sampling circuit of claim 4, wherein an initial value of the accumulation circuit is set to one of a positive maximum accumulated value of the accumulation circuit, a negative maximum accumulated value of the accumulation circuit, a value of 0, and an offset value based on the signal accumulated in the first operation phase.

6. The correlated double sampling circuit of claim 4, further comprising:
an operation circuit configured to add or subtract a maximum accumulated value of the accumulation circuit to or from an accumulation result output by the accumulation circuit, based on the signal accumulated in the first operation phase.

7. A correlated double sampling circuit, comprising:
a delta-sigma modulator configured to receive an input signal, delta-sigma modulate the input signal, invert a modulation signal, and output the modulation signal and an inverted modulation signal;
a selector configured to selectively output one of the modulation signal and the inverted modulation signal in response to a selection signal corresponding to an operation phase; and
an accumulation circuit configured to generate a first accumulation result by performing an accumulation process on one of the modulation signal and the inverted modulation signal in a first operation phase, and generate a second accumulation result by performing the accumulation process on the first accumulation result and the other one of the modulation signal and the inverted modulation signal in a second operation phase.

8. The correlated double sampling circuit of claim 7, wherein the accumulation circuit comprises:
first through N-th accumulators connected in series, wherein N is a natural number greater than or equal to 2, the first accumulator is configured to accumulate an output signal of the selector; and
the second through N-th accumulators are configured to accumulator an output signal of a previous accumulator.

9. The correlated double sampling circuit of claim 7, wherein the accumulation circuit is reset before performing the accumulation process in the first operation phase.

10. The correlated double sampling circuit of claim 9, wherein an initial value of the accumulation circuit is set to one of a positive maximum accumulated value of the accumulation circuit, a negative maximum accumulated value of the accumulation circuit, a value of 0, and an offset value based on the signal accumulated in the first operation phase.

11. The correlated double sampling circuit of claim 9, further comprising:
an operation circuit configured to add or subtract a maximum accumulated value of the accumulation circuit to or from an accumulation result output by the accumulation circuit, based on the signal accumulated in the first operation phase.

12. An image sensor comprising:
the correlated double sampling circuit as claimed in claim 1; and
a pixel array comprising a plurality of pixels, wherein the input signal comprises pixel data corresponding to one of the plurality of pixels.

13. The image sensor of claim 12, wherein the selection circuit comprises:
an inverter configured to receive the modulation signal and generate the inverted modulation signal; and
a selector configured to selectively output one of the modulation signal and the inverted modulation signal in response to the selection signal.

14. The image sensor of claim 12, wherein the accumulation circuit comprises:
first through N-th accumulators connected in series, wherein
N is a natural number greater than or equal to 2,
the first accumulator is configured to accumulate an output signal of the selection circuit, and
the second through N-th accumulators are configured to accumulate an output signal of a previous accumulator.

15. The image sensor of claim 14, wherein the first accumulator is reset before performing the accumulation process in the first operation phase.

16. The image sensor of claim 15, wherein an initial value of the accumulation circuit is set to one of a positive maximum accumulated value of the accumulation circuit, a negative maximum accumulated value of the accumulation circuit, a value of 0, and an offset value based on the signal accumulated in the first operation phase.

17. The image sensor of claim 15, wherein the correlated double sampling circuit further comprises:
an operation circuit configured to add or subtract a maximum accumulated value of the accumulation circuit to or from an accumulation result output by the accumulation circuit, based on the signal accumulated in the first operation phase.

18. An image sensor comprising:
the correlated double sampling circuit as claimed in claim 7; and
a pixel array comprising a plurality of pixels, wherein the input signal comprises pixel data corresponding to one of the plurality of pixels.

19. A correlated double sampling circuit, comprising:
a delta-sigma modulator configured to receive an input signal, delta-sigma modulate the input signal, and output a modulation signal;
a selection circuit configured to invert the modulation signal, output an inverted modulation signal while in a reference phase, and output the modulation signal while in a signal phase; and
an accumulation circuit configured to generate a first accumulation result by performing an accumulation process on the inverted modulation signal while in the reference phase, and generate a second accumulation result by performing the accumulation process on the modulation signal and the first accumulation result while in the signal phase,
wherein the input signal is equal to a sum of a reference signal and an offset component in the reference phase, and the input signal is equal to a sum of the reference signal, the offset component, and a signal component in the signal phase.

20. The correlated double sampling circuit of claim 19, wherein the reference signal is equal to one of the modulation signal and the inverted modulation signal in the reference phase, and a sum of the reference signal and the signal component is equal to the other one of the modulation signal and the inverted modulation signal in the signal phase.

* * * * *